United States Patent
Witek et al.

(10) Patent No.: US 10,243,581 B1
(45) Date of Patent: Mar. 26, 2019

(54) SYSTEM AND METHOD FOR IMPLEMENTING FINITE IMPULSE RESPONSE FILTER IN AN AUDIO PROCESSOR

(71) Applicant: Apple Inc., Cupertino, CA (US)

(72) Inventors: Richard T. Witek, Redmond, WA (US); Peter C. Eastty, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/925,705

(22) Filed: Mar. 19, 2018

(51) Int. Cl.
   *H03M 3/00* (2006.01)

(52) U.S. Cl.
   CPC .......... *H03M 3/504* (2013.01); *H03M 3/496* (2013.01); *H03M 3/506* (2013.01)

(58) Field of Classification Search
   CPC ...... H03M 3/504; H03M 3/506; H03M 3/496; H03M 3/00
   USPC .................................................. 341/155, 143
   See application file for complete search history.

(56) References Cited

U.S. PATENT DOCUMENTS

| | | | | |
|---|---|---|---|---|
| 5,012,245 A | * | 4/1991 | Scott ............... | G11B 20/10527 341/144 |
| 5,057,795 A | * | 10/1991 | Napier ..................... | H03K 3/84 331/78 |
| 6,367,003 B1 | * | 4/2002 | Davis .................... | G06F 9/3001 712/208 |
| 6,701,141 B2 | * | 3/2004 | Lam ......................... | H01Q 3/26 342/368 |
| 7,418,467 B2 | * | 8/2008 | Hennedy ............ | H03H 17/0288 708/303 |
| 8,417,749 B1 | | 4/2013 | Dick | |
| 2007/0069929 A1 | * | 3/2007 | Mallinson ............. | H03M 3/344 341/143 |
| 2008/0208291 A1 | * | 8/2008 | Leyde .................. | A61B 5/0031 607/60 |
| 2012/0284487 A1 | | 11/2012 | Saha et al. | |
| 2016/0217802 A1 | | 7/2016 | Savell | |

FOREIGN PATENT DOCUMENTS

WO   2010104892   9/2010

OTHER PUBLICATIONS

P. Eastty, "DSD—Wide a Practical Implementation for Professional Audio," Audio Engineering Society Convention Paper 5377 Presented at the 110th Convention May 12-15, 2001, 12 pages.

* cited by examiner

*Primary Examiner* — Jean B Jeanglaude
(74) *Attorney, Agent, or Firm* — Meyertons, Hood, Kivlin, Kowert & Goetzel, P.C.; Erik A. Heter (57) ABSTRACT

A method and apparatus for implementing FIR filters in a processor includes a plurality of execution units executing instructions of an instruction set. The execution units include a number of FIR filter circuits, each of which is associated with a corresponding one of a number FIR filter instructions. Furthermore, each of the FIR filter circuits is and dedicated exclusively to executing its corresponding one of the FIR filter instructions. Each FIR filter execution unit receives input data and provides filtered output data.

20 Claims, 5 Drawing Sheets

// Selects for FIR Instructions
b_K_sel_0 = ^t0x00000000

| 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |

// Selects for FIR Instructions
b_K_sel_1 = ^t0x40000000

| 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |

// Selects for FIR Instructions
b_K_sel_2 = ^t0x80000000

| 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |

// Selects for FIR Instructions
b_K_sel_3 = ^t0x0000000

| 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |

SYSTEM AND METHOD FOR IMPLEMENTING FINITE IMPULSE RESPONSE FILTER IN AN AUDIO PROCESSOR

BACKGROUND

Technical Field

This disclosure is directed toward audio processing circuits, and more particularly, to the implementation of finite impulse response (FIR) filters.

Description of the Related Art

Digital signal processing is commonly performed in many electronic systems. For example, systems that include a microphone for inputting sound often times convert corresponding analog (electrical) signals into digital signals, or data. From there, various signal processing functions may be performed on the data.

A common function performed in digital signal processing is filtering signals to focus on particular frequencies of interest. Two of the most common digital filters are the infinite impulse response (IIR) filter and the finite impulse response (FIR) filter. For an IIR filter, the amount of time the filter responds to an input is indefinite, whereas a FIR filter has a finite response time. For the FIR filter of an Nth order, the impulse response time is N+1 sample before the response settles to zero. Both types of filters may have advantages and disadvantages relative to the other. For example, a FIR filter does not require any internal feedback. On the other hand, an IIR filter may require less computational power than a FIR filter.

SUMMARY

A method and apparatus for implementing FIR filters is disclosed. In one embodiment, a processor includes a plurality of execution units for executing instructions of an instruction set. The execution units include a number of FIR filter circuits, each of which is associated with a corresponding one of a number FIR filter instructions. Furthermore, each of the FIR filter circuits is and dedicated exclusively to executing its corresponding one of the FIR filter instructions. Each FIR filter execution unit receives input data and provides filtered output data. The filtered data output is produced by the FIR filter circuit within a single execution cycle.

In one embodiment, analog signals (e.g., based on received audio) are input into an analog-to-digital converter (ADC) and output as pulse density modulation (PDM) data in a series of single-bit samples. The samples are bits serially input into a shift register. When a predetermined number of bits are received, a FIR filter instruction is invoked, and selected ones of the predetermined number of bits are provided to the corresponding FIR filter circuit. The FIR filter circuit then executes its corresponding FIR filter instruction and produces an output within a single execution cycle. The output data is provided at a sample rate that is less than the sample rate at which PDM data is provided to the shift register.

A system embodiment is also disclosed. An audio input device (e.g., a microphone) converts audio signals into corresponding analog electrical signals. The analog signals are then provided to an ADC, such as a sigma-delta ADC, which converts the analog electrical signals into digital samples, which are then forwarded to a shift register as a series of single bits. Selected ones of the samples (e.g., selected by a multiplexer) are provided to the FIR filter circuit to execute the FIR filter instruction and thus provide filtered output data for further processing and/or storage.

BRIEF DESCRIPTION OF THE DRAWINGS

The following detailed description makes reference to the accompanying drawings, which are now briefly described.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Figure 1:
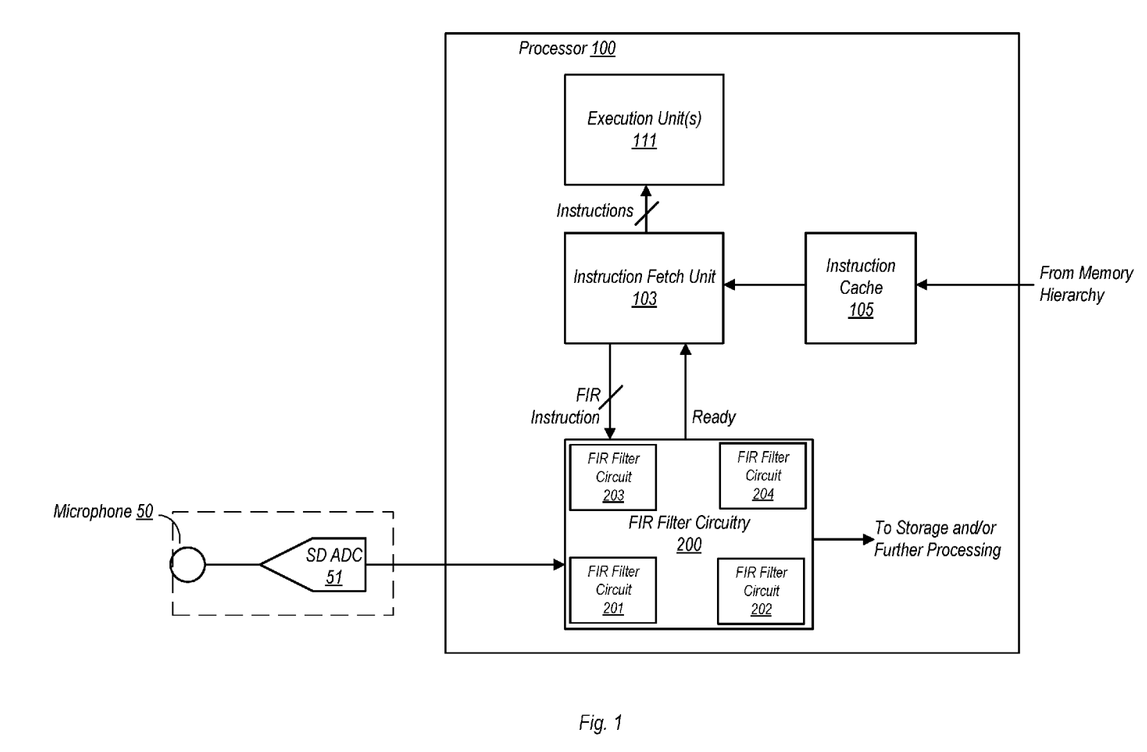
FIG. 1 is a block diagram of one embodiment of a system including an audio input.

Turning now to FIG. 1, a block diagram of one embodiment of a system including an audio input is shown. The system as shown in FIG. 1 includes a processor 100, as well as an apparatus that includes microphone 50 and sigma-delta analog-to-digital converter (SD ADC) 51 (which can be implemented as part of the processor in some embodiments). Processor 100 in one embodiment shown may be explicitly implemented as an audio signal processor, although the disclosure is not limited in this manner. For example, processor 100 may be a digital signal processor that performs processing functions for numerous types of signals converted into the digital domain. It is further noted that processor 100 as shown here is simplified for the sake of illustration, but it not intended to be limiting to any specific type of processor.

In the embodiment shown, processor 100 includes an instruction cache 105, an instruction fetch unit 103, execution units 111 and FIR filter circuitry 200. Additional circuit blocks may also be included in processor 100 (e.g., register files, a data cache, and so on), but are not shown here for the sake of simplicity. Instruction cache 105 may receive instructions from lower levels of a memory hierarchy, which may include additional caches and a main memory (e.g., random access memory, or RAM). These instructions are stored in the instruction cache and accessed by instruction fetch unit 103. Instruction fetch unit 103 may in turn issue instructions for execution. Various instructions of the instruction set of processor 100 may be issued to execution units 111, which may include multiple execution units capable of executing instructions of one or more different types of data (e.g., floating point, fixed point, etc.).

The instruction set associated with processor 100 also includes those for implementing finite impulse response (FIR) filters. However, rather than executing FIR filter instructions using the circuitry of general purpose execution units, processor 100 includes FIR filter circuitry 200 that is dedicated exclusively to execution of FIR filter instructions. In this embodiment, four different FIR filter circuits (201, 202, 203, and 204) are included, although the number may vary from one embodiment to the next. The instruction set of processor 100 may include a number of different FIR filter instructions. Correspondingly, FIR filter circuitry 200 in the embodiment shown includes a number of different FIR filter circuits, each of which is associated with a corresponding FIR filter instruction. Thus, each of the particular FIR filter circuits within FIR filter circuitry 200 is dedicated exclusively to execution of its corresponding FIR filter instruction. Upon completing execution of a FIR filter instruction, FIR filter circuitry 200 outputs filtered data, which may be provided to storage (e.g., registers, a data cache, etc.) and/or to other circuit units for further processing.

FIR filter circuitry 200 in the embodiment shown is configured to provide an indication that it is ready to receive a FIR filter instruction via the use of the 'Ready' signal. As will be discussed below, FIR filter circuitry may include at least one counter that is arranged to count the number of incoming samples from SD ADC 51. In one embodiment, SD ADC 51 provides single-bit samples as pulse density modulation (PDM) data values. When a predetermined number of samples has been received, the counter may cause assertion of the 'Ready' signal, which is received by instruction fetch unit 103. Responsive to assertion of this signal, instruction fetch unit 103 may issue a FIR filter instruction to FIR filter circuitry 200, with the instruction subsequently being executed by corresponding FIR filter circuitry. In embodiment in which multiple FIR filter instructions are implemented, the FIR filter instruction information may include information used to select the corresponding FIR filter circuit, and may additionally include other information, such as selection signals for selecting data to be processed by the corresponding FIR filter circuit.

It is noted that while FIR filter circuitry 200 is discussed herein as including a number of FIR filter circuits each corresponding to a particular one of a number of FIR filter instructions, embodiments are possible and contemplated, within the scope of this disclosure, in which as few as one FIR filter circuits and as few as one FIR filter instructions are implemented.

The use of dedicated FIR filter circuits to execute corresponding FIR filter may provide certain advantages. In the embodiment shown, each of the FIR filter circuits within FIR filter circuitry 200 may execute its corresponding FIR filter instruction within a single instruction cycle (e.g., within a single cycle of a clock signal provided to processor 100). In contrast, embodiments using general purpose execution circuitry and/or microcode routines to implement a FIR filter may require a number of instruction cycles to perform the FIR filtering functions. Thus, the various dedicated FIR filter instructions disclosed herein may be executed faster than would otherwise be possible. Additionally, execution of the FIR filter instructions in dedicated circuitry may free other general purpose execution units within processor 100 to perform other functions.

Each FIR filter instruction may in turn be defined by a decimation ratio and a number of taps. The decimation ratio of a FIR filter instruction defines a ratio in which the sampling rate of the filtered output data is reduced relative to the input data. For example, a decimation ratio of four indicates that the sampling rate of the filtered output data is less than the sampling rate of the input data (produced by SD ADC 51 in the embodiment discussed herein) by a factor of four. The number of taps indicated in the FIR filter instruction corresponds to the number of taps of the FIR filter that is implemented.

Figure 2:
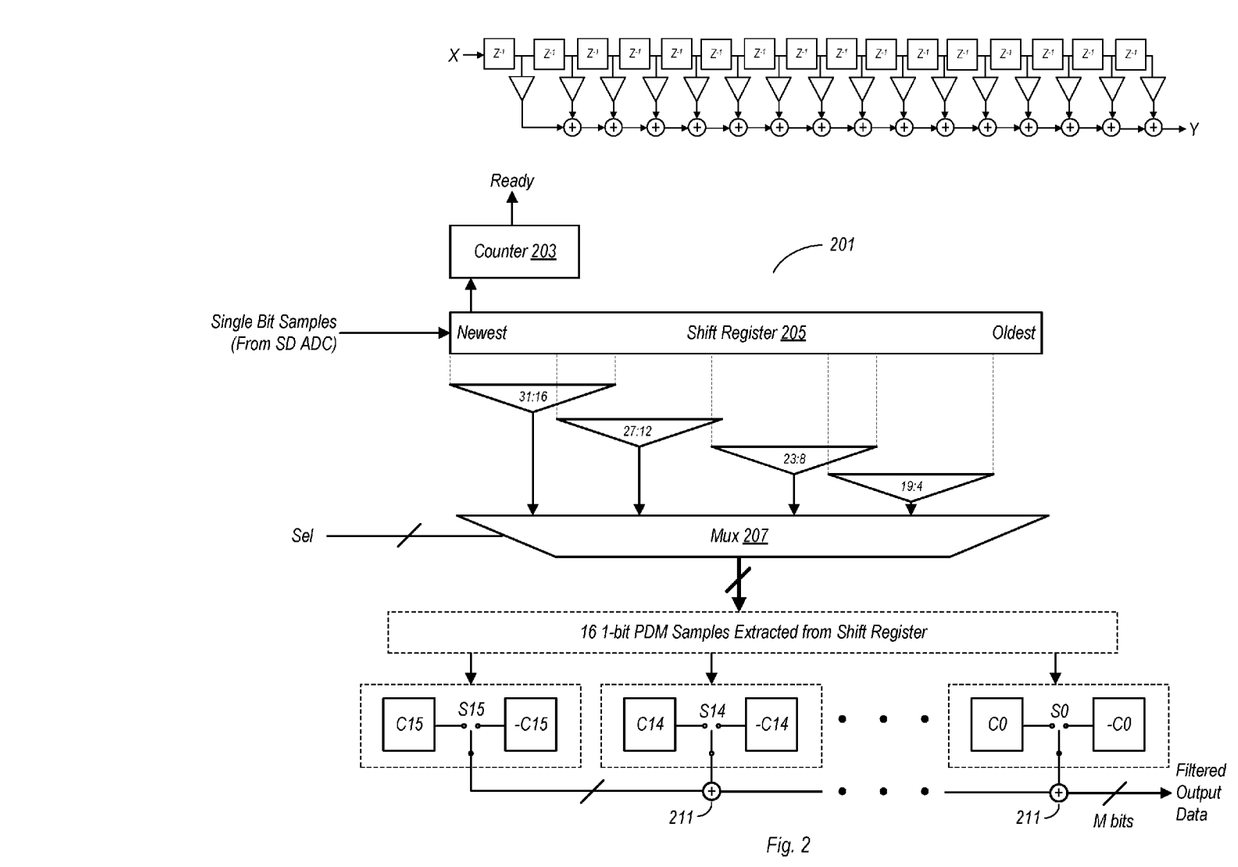
FIG. 2 is a diagram of one embodiment of a circuit for executing a FIR filter instruction.

FIG. 2 is a diagram of one embodiment of a circuit for executing a FIR filter instruction. In the embodiment shown, the circuit shown is arranged to implement a fifth order FIR filter with a decimation ratio of four and having sixteen taps. Mnemonically, such an instruction may be referred to, in one embodiment, as the FIR4_16 instruction. Generally speaking, the FIR filter instructions of the FIR filter circuit may have the format of FIR[D]_[T], where D is the decimation ratio and T is the number of taps. To give another example, the instruction FIR3_9 implements a FIR filter instruction having a decimation ratio of three and nine taps.

The corresponding representation of the filter implemented is shown at the top of the drawing, whereas the actual circuitry for implementing the same is shown underneath the filter representation. The arrangement of the circuitry for implementing other types of FIR filters (e.g., different decimation ratio and different number of taps) will become apparent to one of skill in the art upon examining FIG. 2 and reading the corresponding description herein. In this embodiment, the FIR filter is a fifth order FIR filter that may alternatively be represented as a cascade of five 4-tap boxcar filters that is equivalent to the arrangement shown at the top of the page, as will also be apparent to one skilled in the art.

FIR filter circuit 201 in the embodiment shown includes a shift register 205 that is arranged to receive single-bit samples from SD ADC 51 as shown in FIG. 1. More generally, shift register 201 may be arranged to receive single-bit samples from any source capable of providing the same. In some embodiments, each unique FIR filter circuit may share shift register 205, while in other embodiment, each unique FIR filter circuit may include its own, dedicated instance of shift register 205. As shown in FIG. 2, the newest samples are shifted in on the left-hand side and to the right toward the oldest samples.

Counter 203 is coupled to count single-bit samples incoming to shift register 205. In this particular embodiment, shift register 205 is a 32-bit register, although other embodiments may utilize other register sizes (with the size depending on the type of FIR filters implemented and thus the number of bits needed to perform the desired filtering operation). When counter 203 counts 32 new, incoming single-bit samples, it responds in the illustrated embodiment by asserting the "Ready" signal, which is received by instruction fetch unit 103. Responsive to receiving the "Ready" signal, instruction fetch unit 103 may issue a FIR filter instruction. In the case of the embodiment shown in FIG. 2, this instruction is, per the nomenclature discussed above, the FIR4_16 instruction. However, in embodiments having multiple FIR filter circuits, another FIR filter instruction may be issued. Although not explicitly shown in FIG. 1, FIR filter circuitry 200 may include additional selection and routing circuitry to cause selection and operation of the FIR filter circuit that corresponds to the issued instruction.

The issued FIR filter instruction received by FIR filter circuit 201 includes selection signals that are provided to multiplexer 207. Multiplexer 207 in the illustrated embodiment receives a number of different multi-bit inputs and provides a multi-bit output. Each of the multi-bit inputs includes bits selected from various windows, as shown (e.g., 31:16, 21:12, etc.), with some overlap between the various windows. The selected ones of the bits from each window add up to a total of 16 single bit PDM samples that are extracted from shift register 205. Each of these single-bit samples is then multiplied by a coefficient, e.g., C15 or −C15, etc, the values of which may be hardcoded into the instruction circuitry itself. In PDM data, each bit may represent a '1' or a '−1', with the former represented by a logic 1 and the latter represented by a logic 0. Thus, each switch causes a multiplication of a coefficient by either a '1' or a '−1', depending on the corresponding selected bit sample. Thus, for example, if bit sample 15 (of selected samples 15:0) is a logic 1, switch S15 selects C15, otherwise −C15 is selected. In an alternate embodiment, a logic 1 can be a +1, with logic 0 representing 0, with the sum be subsequently corrected by dividing it in half. The coefficients themselves may be stored in a memory location and/or provided therefrom.

After performing the multiplication operation discussed above, the various products of the multiplications may be added by adder circuits 211. These circuits are shown as being coupled in a cascaded manner, although this arrangement is not a requirement, as explained below. The addends provided into each adder circuit are m-bit products produced by the multiplications and previous calculated sums. For example, the first adder circuit 211 (left-most in the drawing) adds the product output from switch S15 and the product from switch S14. Meanwhile the final adder circuit 211 is arranged to add the product from S0 to the sum of all previous addition operations. The final output of filtered output data is an m-bit value that is forwarded to other circuitry for further processing (e.g., packetizing), to storage for later use, or both.

It is noted that the arrangement of the adders shown in FIG. 2 is an example arrangement provided for simplicity and sake of illustration. However, in practice, embodiments are possible in which the products are added in any suitable order and thus do not need to comply with the cascaded arrangement shown here.

Figure 3:
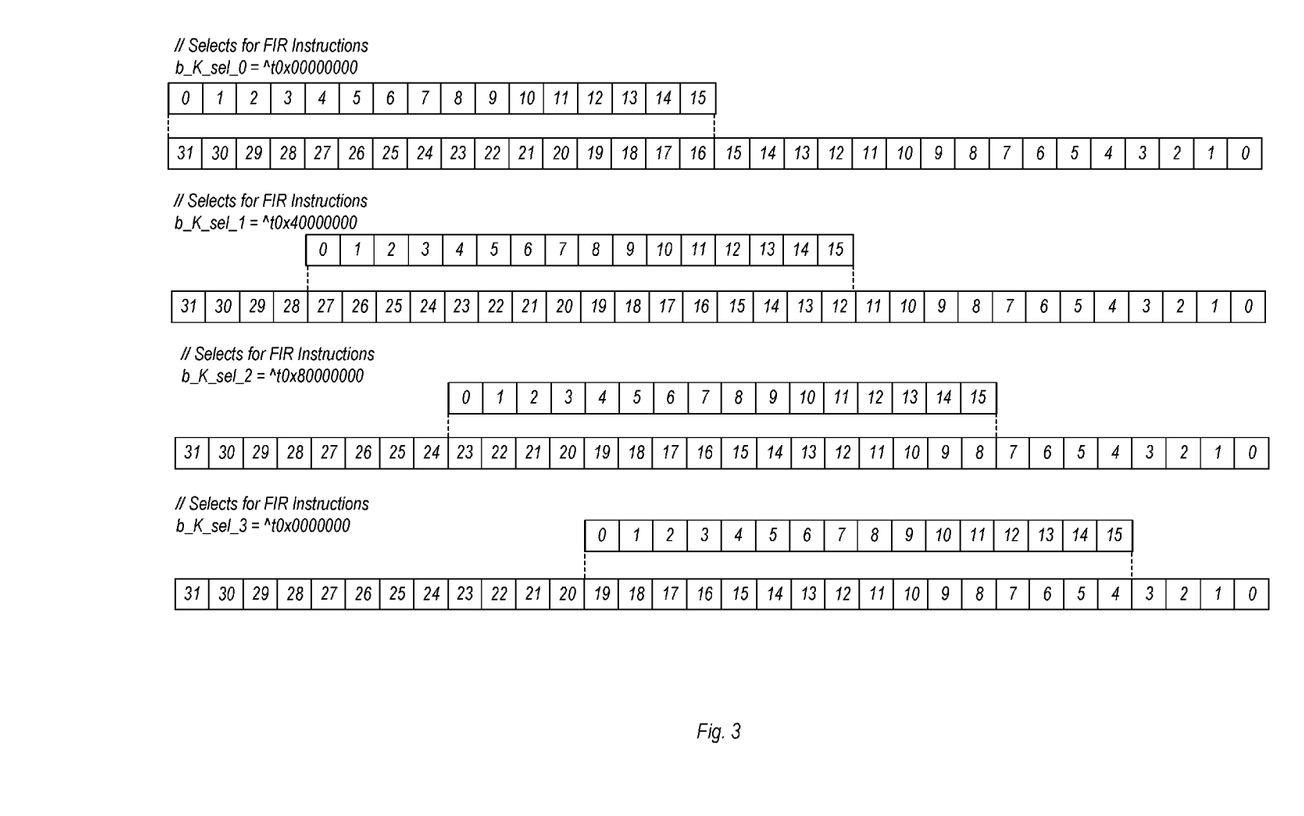
FIG. 3 is a diagram further illustrating the operation of one embodiment of a FIR filter circuit.

FIG. 3 is a diagram further illustrating the operation of one embodiment of a FIR filter circuit. In particular, FIG. 3 illustrates the windowing operation in which bits are selected from the samples received in the shift register. Each window in the embodiment shown is based on certain selection signals, as indicated in the drawing, and includes 16 bits. From the 16 bits of each window, a particular number of bits it selected and provided at the bits used in the multiplication of coefficients. Each window allows for a certain number of bits to be selected, while the size of the register limits the number of selection that can be made therefrom. For example, a FIR5_21 filter uses 21 bits for a first selection, 21+5=26 bits for the second selection, 21+10 bits for the third selection, and 21+15 bits for the fourth section (or 36 bits total, with the shift register being at least 36 bits). Each window allows for a larger collection of bits to be processed concurrently within multiple FIR instructions when the register is shared among multiple FIR filter circuits. As noted above, the register size may various from one embodiment to another, with the register size being dependent on the requirements of the FIR filters that receive bits therefrom.

Figure 4:
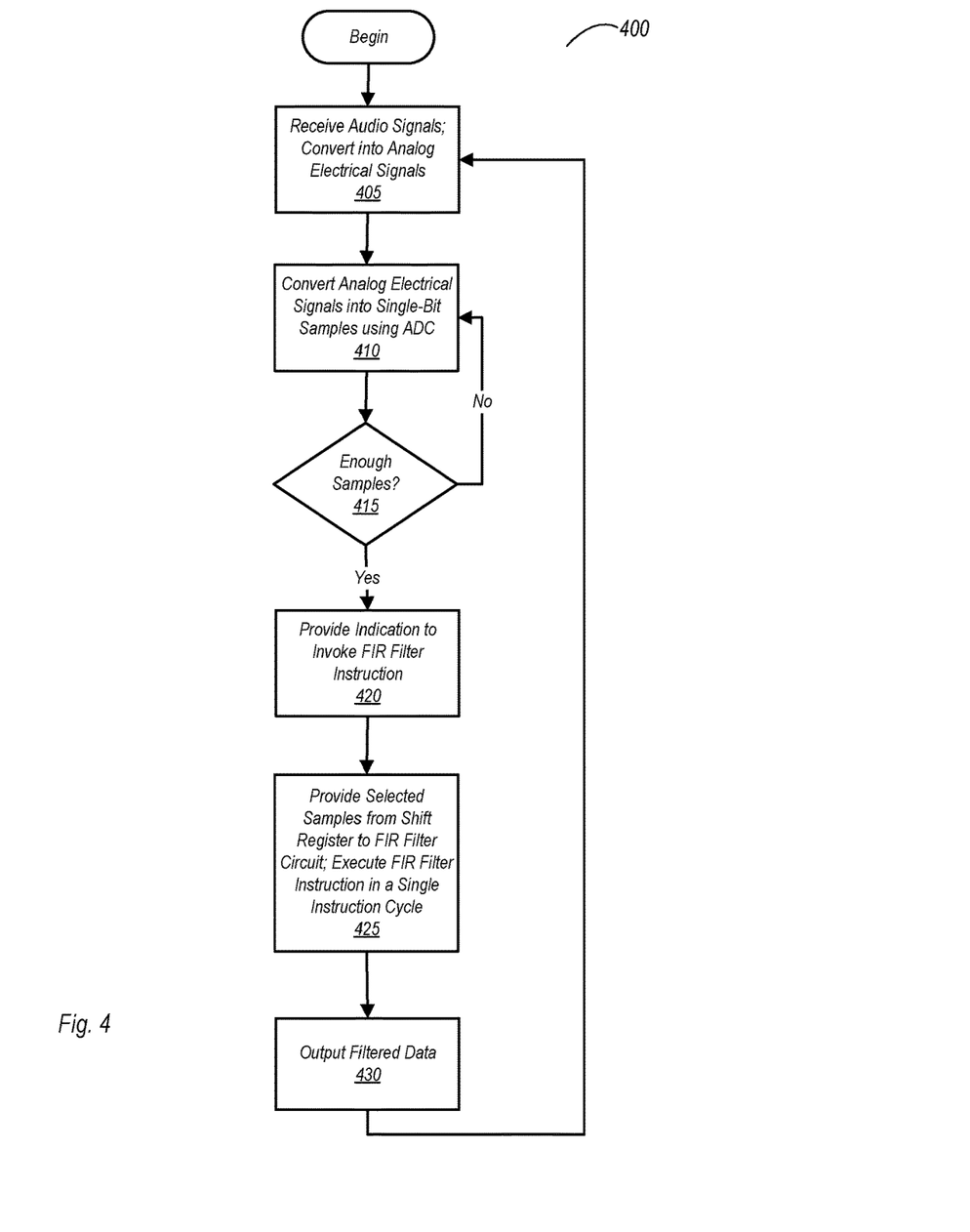
FIG. 4 is flow diagram illustrating one embodiment of a method for performing a FIR filtering operation using a FIR filtering circuit.

FIG. 4 is flow diagram illustrating one embodiment of a method for performing a FIR filtering operation using a FIR filtering circuit. Method 400 may be performed with any of the hardware variations discussed above, as well as with embodiments not explicitly discussed herein. Such embodiments capable of performing method 400 may be considered to fall within the scope of this disclosure.

Method 400 includes receiving audio signals and converting the audio signals into corresponding analog electrical signals (block 405). The audio signals may be received by a microphone or other device capable of converting audio signals into electrical signals. The analog electrical signals are then converted into digital samples using an ADC (block 410). In one embodiment, the single-bit samples may be PDM data, and the ADC may be a sigma-delta ADC. It is noted however that other types of modulation and the use of other types of ADCs are possible and contemplated. After conversion, samples are forwarded, in one embodiment, as a series of single bits to a shift register, which provides temporary storage prior to further processing.

If the number of samples received has not reached a predetermined threshold (block 415, no), the method continues with the conversion of electrical signals into single-bit samples. Once the predetermined number of samples has been received (block 415, yes), an indication is provided to invoke the execution of a FIR filter instruction (block 420). As per various embodiments discussed above, the instruction may be invoked by a counter indicating that the predetermined number of samples has been received, with an instruction fetch unit issuing the FIR filter instruction. However, other mechanisms to carry out this portion of method 400 are also possible and contemplated.

After the invoking and issuance, the FIR filter instruction may be executed. Execution of the FIR filter instruction includes providing selected ones of the single-bit samples from the shift register to FIR filter circuitry that corresponds to the FIR filter instruction, and the completion of executing within a single instruction cycle (block 425). The FIR filter circuit may then provide as an output data that has been filtered to another location for storage and/or further processing (block 430). The filtered output data may also be decimated relative to the input data (the single-bit samples), meaning its sampling rate is lower than that of the data when originally sampled and converted into digital data. Method 400 is an ongoing method, and thus returns to block 405 and repeats.

While the embodiment shown above is arranged for use with single bit signals/samples, embodiments arranged for what are known as 1.5 bit signals are also possible and contemplated. With regard to 1.5 signals, two bits per sample may be provided, with three of the four possible combinations representing the values of +1, 0, and −1.

Figure 5:
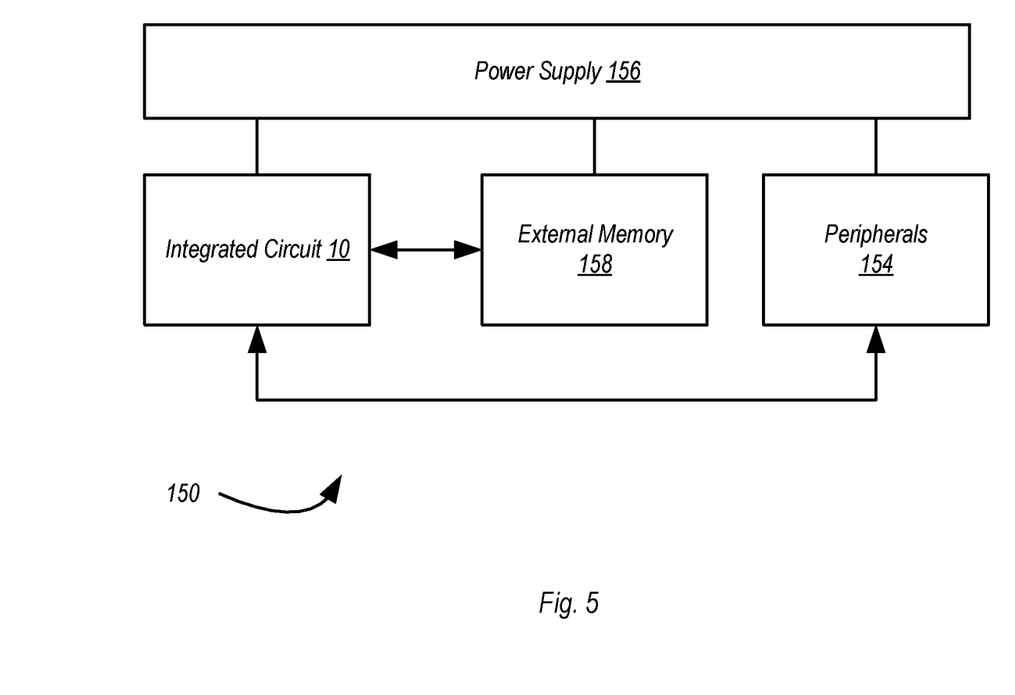
FIG. 5 is a block diagram of an example system.

Turning next to FIG. 5, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A processor comprising:
 a plurality of execution units each comprising circuitry configured to execute instructions of an instruction set, wherein the plurality of execution circuits include:
  a plurality of finite impulse response (FIR) filter circuits each configured to execute a corresponding one of a plurality of FIR filter instructions of the instruction set, wherein responsive to the processor issuing a given one of the plurality of FIR filter instructions, a corresponding one of the plurality of FIR filter circuits is configured to execute the given one of the plurality of FIR filter instructions to provide filtered output data within a single instruction cycle;
  wherein each of the plurality of FIR filter circuits is dedicated to executing its corresponding one of the plurality of FIR filter instructions.

2. The processor as recited in claim 1, further comprising a shift register coupled to serially receive data, and further coupled to provide data to at least one of the FIR filter circuits.

3. The processor as recited in claim 2, further comprising a sigma-delta analog-to-digital converter (ADC) coupled to serially provide data to the shift register, wherein the sigma-delta ADC is configured to output pulse-density modulated (PDM) data generated based on audio signals.

4. The processor as recited in claim 2, wherein each of the plurality of FIR filter circuits is coupled to receive input data at a first sampling rate, and further configured to provide the filtered output data at a sampling rate that is less than the first sampling rate.

5. The processor as recited in claim 2, wherein each of the FIR filter circuits is coupled to receive input data from the shift register.

6. The processor as recited in claim 5, wherein the each of the plurality FIR filter circuits includes a corresponding multiplexer configured to, during execution of its corresponding one of the plurality of FIR filter instructions, select a subset of bits stored in the shift register.

7. The processor as recited in claim 2, further comprising a counter coupled to the shift register, wherein the counter is configured to count samples input into the shift register, and further configured to indicate when the shift register has received a predetermined number of samples.

8. The processor as recited in claim 1, wherein each of the plurality of FIR filter instructions is defined by an order and a decimation ratio.

9. A method comprising:
generating analog electrical signals based on received audio signals;
converting the analog electrical signals into a plurality of single-bit samples;
receiving the single-bit samples into a shift register;
responsive to receiving a predetermined number of single-bit samples, invoking a selected one of a plurality of finite impulse response (FIR) filter instructions; and
executing the one of the plurality of FIR filter instructions using a corresponding FIR filter circuit dedicated to the selected one of the plurality of FIR filter instructions, wherein executing comprises providing filtered output data within a single instruction cycle.

10. The method as recited in claim 9, further comprising a sigma-delta analog-to-digital converter (ADC) converting the analog electrical signals into the plurality of single-bit samples.

11. The method as recited in claim 9, further comprising the corresponding FIR filter circuit providing the filtered output data at a sampling rate that is less than a sampling rate at which the single bit samples are input into the shift register.

12. The method as recited in claim 9, further comprising multiplexer circuitry selecting particular ones of the single-bit samples to be provided to the FIR filter circuit.

13. The method as recited in claim 9, wherein each of the plurality of FIR filter instructions is defined by an order and a decimation ratio.

14. A system comprising:
an analog-to-digital converter (ADC) configured to convert analog electrical signals into a digital data stream of single-bit samples;
a processor including a shift register coupled to serially receive the single-bit samples, and execution circuitry configured to execute instructions of an instruction set, wherein the execution circuitry includes:
one or more finite impulse response (FIR) filter circuits each dedicated to executing a corresponding FIR filter instruction, wherein the FIR filter circuit is configured to receive selected ones of the single-bit samples and execute the corresponding FIR filter instruction to provide filtered output data within a single machine cycle.

15. The system as recited in claim 14, wherein each of the FIR filter circuits is configured to provide the filtered output data at a sampling rate that is less than a sampling rate at which the ADC provides the single-bit samples.

16. The system as recited in claim 14, further comprising a counter configured to count a number of samples input into the shift register, and further configured to provide an indication when the number of samples has reached a predetermined value.

17. The system as recited in claim 14, wherein each of the FIR filter instructions is defined by an order and a decimation ratio.

18. The system as recited in claim 14, wherein the ADC is a sigma-delta ADC.

19. The system as recited in claim 18, wherein the sigma-delta ADC is configured to output the single bit samples as pulse density modulation (PDM) data.

20. The system as recited in claim 14, further comprising an audio input including a microphone configured to convert received audio signals into the analog electrical signals.

* * * * *